United States Patent [19]

Schuhl et al.

[11] Patent Number: 5,239,187

[45] Date of Patent: Aug. 24, 1993

[54] JOSEPHSON EFFECT SEMICONDUCTOR DEVICE WITH CHANNEL LAYERS OF SEMICONDUCTOR AND SUPERCONDUCTOR MATERIALS

[75] Inventors: Alain Schuhl, Clamart; Stéphane Tyc; Alain Friederich, both of Paris, all of France

[73] Assignee: Thomson-CSF, Puteaux, France

[21] Appl. No.: 844,773

[22] Filed: Mar. 2, 1992

[30] Foreign Application Priority Data

Mar. 15, 1991 [FR] France ................. 91 03186

[51] Int. Cl.$^5$ .................. H01L 39/22; H01B 12/00; G11C 11/44
[52] U.S. Cl. .................. 257/36; 257/38; 257/39; 505/1; 505/702; 505/832
[58] Field of Search ............ 357/5; 505/1, 702, 832; 257/36, 38, 39

[56] References Cited

U.S. PATENT DOCUMENTS

| | | | |
|---|---|---|---|
| 4,589,001 | 5/1986 | Sakai et al. | 357/5 |
| 4,675,711 | 6/1987 | Harder et al. | 357/5 |
| 5,071,832 | 12/1991 | Iwamatsu | 357/5 |
| 5,126,801 | 6/1992 | Nishino et al. | 357/5 |
| 5,138,401 | 8/1992 | Yamazaki | 357/5 |

FOREIGN PATENT DOCUMENTS

| | | | |
|---|---|---|---|
| 0181191 | 5/1986 | European Pat. Off. | |
| 1-290271 | 11/1989 | Japan | 357/5 |
| 2-194665 | 8/1990 | Japan | 357/5 |
| 3-102883 | 4/1991 | Japan | 357/5 |

OTHER PUBLICATIONS

Patent Abstract of Japan, vol. 012, No. 423 (E-680), Nov. 9, 1988, & JP-A-63 160 273, Jul. 4, 1988, S. Koji, et al., "High-Speed Semiconductor Device".

*Primary Examiner*—Rolf Hille
*Assistant Examiner*—Mahshid Saadat
*Attorney, Agent, or Firm*—Oblon, Spivak, McClelland, Maier & Neustadt

[57] ABSTRACT

Disclosed is a transistor or diode type Josephson effect device, at least two electrodes of which are made of superconductive material. If the Josephson effect is to be exerted in a semiconductor layer between the access electrodes, the distance between them should be smaller than the length of coherence, namely 10 to 1000 angstroms. According to the disclosure, the control channel between access electrodes is replaced by two channels perpendicular to the semiconductor layer, located between the two access electrodes and a layer of superconductive material placed between the substrate and the semiconductor layer. The disclosure can be applied to transistors, phototransistors and diodes with high switching speed.

11 Claims, 2 Drawing Sheets

JOSEPHSON EFFECT SEMICONDUCTOR DEVICE WITH CHANNEL LAYERS OF SEMICONDUCTOR AND SUPERCONDUCTOR MATERIALS

BACKGROUND OF THE INVENTION

1. Field of the Invention

The present invention relates to a Josephson effect field-effect transistor wherein the active layer, made of a semiconductor material, is deposited on a layer of superconductive material.

The Josephson effect is an effect, related to superconductors, by which a superconductive current or supercurrent may exist in a semiconductor by an effect of proximity with a superconductor.

Components based on a superconductive effect will certainly find numerous applications in the near future. Their low heat dissipation associated with a very high switching speed means that they are especially promising for large-scale integrated logic circuits of the LSI or VLSI type.

2. Description of the Prior Art

Several models of field-effect transistors using the Josephson effect (JOFETS) have been described, in particular by A. W. Kleinsasser et al. in S. Ruggiera and D. Rudman ed. *Superconducting Devices*, Academic Press, 1990. This is a field-effect transistor with an architecture that is quite standard. Its source and drain metallizations are made of superconductive materials. The semiconductor channel bears a superconductive current (modulated by the gate) owing to the above-mentioned proximity effect.

However, one of the chief drawbacks of these types of transistors comes from the small length of coherence of the superconductivity in semiconductor materials, namely the length on which the proximity effect is exerted. To obtain significant supercurrents, it is necessary to have extremely small channel lengths, for example, of the order of 10 to 1000 angstroms or 0.1 $\mu$m. With current technologies of masking, even by electron or X-ray beams, there is no known way of making a transistor wherein the source and the drain are at a distance of 0.1 $\mu$m from each other and, in addition, with a gate metallization between the two metallizations, namely the source and drain metallizations.

This is why the characteristics of the JOFETs according to the prior art are not good enough to be useful.

SUMMARY OF THE INVENTION

The invention proposes a solution to this difficulty of making JOFETs. Since the current technology does not permit the making, in a horizontal plane, of a semiconductor channel with a length that is at most equal to the length of coherence, this channel is, according to the invention, divided into two vertical channels included in a layer of semiconductive material deposited on layer of superconductive material, and a supercurrent moves in the semiconductor channels by proximity effect. For this purpose, the thickness of the semiconductor layer should be at most equal to the length of coherence, for the pair of materials considered: namely superconductor and semiconductor materials. A presently insuperable difficulty of masking in a horizontal plane has thus been replaced by a difficulty of epitaxial thickness that can be perfectly coped with.

More precisely, the invention relates to a Josephson effect semiconductor device comprising a substrate, at least one layer of semiconductor material and at least two access electrodes, called source and drain electrodes, made of superconductive material, namely a device wherein a layer of superconductive material is interposed between the substrate and the layer of semiconductor material and wherein this layer of semiconductor material has a thickness at most equal to the length of coherence of the superconductivity in the semiconductor material.

BRIEF DESCRIPTION OF THE DRAWINGS

The invention shall be understood more clearly from the following more detailed description of a superconductor transistor, in relation to the appended drawings, of which.

MORE DETAILED DESCRIPTION

Figure 1:
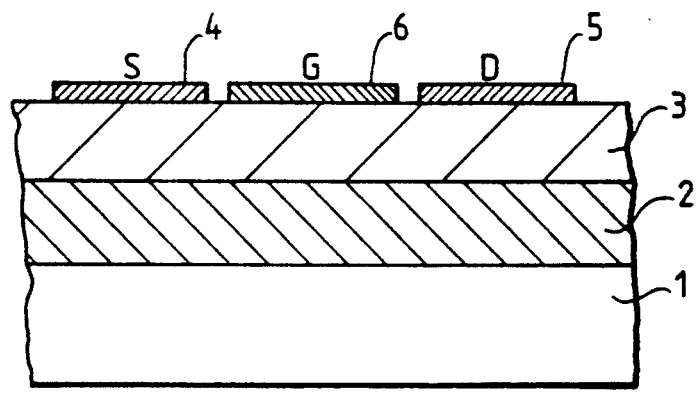
FIG. 1 shows a sectional view of a superconductor field-effect transistor according to the invention.

FIG. 1 shows a section of a JOFET according to the invention, but it is quite a general view: the number, nature and shape (trench, mesa etc.) of the layers may be different, depending on the requirements of the application to which they are put.

The transistor includes a substrate 1, which may be made either of silicon (semiconductor) or of materials belonging to the III-V group such as GaAs (they may be semi-insulator materials) or again of materials which are not semiconductive, such as sapphire, zirconia, glass, alumina, aluminium nitride, strontium titanate etc. Indeed, on this substrate, a layer 2 of superconductor material is deposited and there are, therefore, no longer the same problems associated with the matching of crystal lattice parameters as between Si and GaAs for example. A buffer layer may be necessary, depending on the pair of materials present.

The superconductive layer 2 has a thickness of the order of 1000 angstroms or 1 $\mu$m and it is deposited by cathode sputtering, laser ablation or molecular beam epitaxy (MBE), for example. The nature of the superconductive material is not specific to the invention, but it is preferably a superconductor with a high critical temperature, of the type known by the abbreviation YBaCuO, wherein the yttrium may be replaced by thallium, dysprosium or europium or, again, it may be of the indium-doped lead-tin-tellurium alloy type. What is important in the choice of the superconductive material is that the conditions of deposition and of annealing needed to obtain a substantial fraction of superconductive volume should be compatible with the nature of the substrate 1.

The superconductive layer 2 may be uniform on the substrate 1 or, as shall be seen hereinafter, it may be limited to regions that correspond to the channel of the transistor.

A layer 3 of semiconductive material is deposited on the layer 2 of superconductor. It is represented as being homogeneous in FIG. 1 but may actually be more complex and may include, for example, a smoothing layer in contact with the layer 2 and contact regions with heavier doping beneath the source electrode 4 and drain electrode 5.

These electrodes 4 and 5, deposited on the surface of the semiconductor layer, are made of superconductive materials, as is their entire interconnection, so that a supercurrent can flow throughout the circuit without a high resistance being offered by any element when the channel of the transistor is superconductive.

The gate electrode 6, between the two electrodes, namely the source and drain electrodes, may be an electrode with Schottky metallization, or insulated by a layer (not shown) of oxide or insulator or, again, formed by a pn junction. It is important to note that the gate is long, as compared with the prior art.

The thickness of the semiconductor layer 3 varies from 10 angstroms to 1000 angstroms, or even to 1 $\mu$m, i.e. it is comparable to the length of coherence for the superconductor/semiconductor pair considered. For, this length varies from 10 angstroms for older superconductive materials to 1000 angstroms for superconductive materials with high critical temperatures ($>20°$ K.). It even reaches 1 $\mu$m in certain cases. The Josephson effect may then occur vertically, perpendicularly to the layers, twice, between the source electrode 4 and the buried superconductive layer 2, on the one hand, and between the drain electrode 5 and the same layer 2 on the other. The vertical structure of the device notably simplifies its making. Indeed, the usual techniques used for the growth of materials can be used to achieve vertical resolution levels that are much finer than the horizontal resolution levels obtained by etching techniques and it is possible to grow them atomic layer by atomic layer.

In the horizontal plane, or parallel to the layers, the semiconductor channel of the JOFET which extends from the source to the drain has a length that is far greater than the length of coherence and in the present state of the art, it is of the order of 1 to 3 $\mu$m. But this semiconductive channel in the layer 3 is coupled to a superconductive channel in the layer 2, which provides for a propagation of the coherence, by proximity effect, on a greater distance than that caused by the Josephson effect alone.

Figure 2:
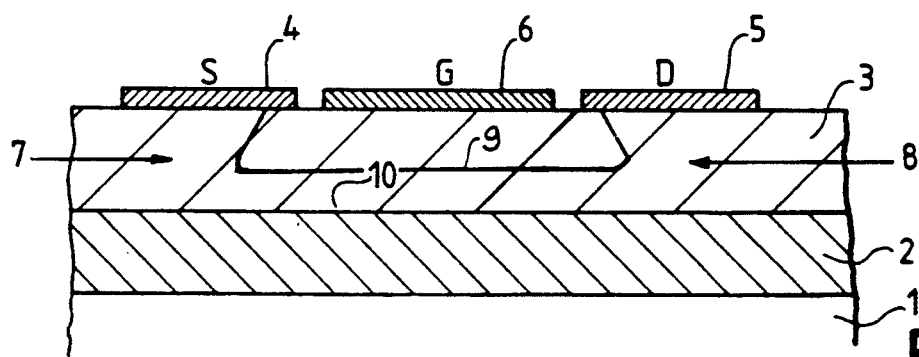
FIGS. 2 and 3 show sectional views of the channel region of a transistor according to the invention, for two different gate voltages.
Figure 3:
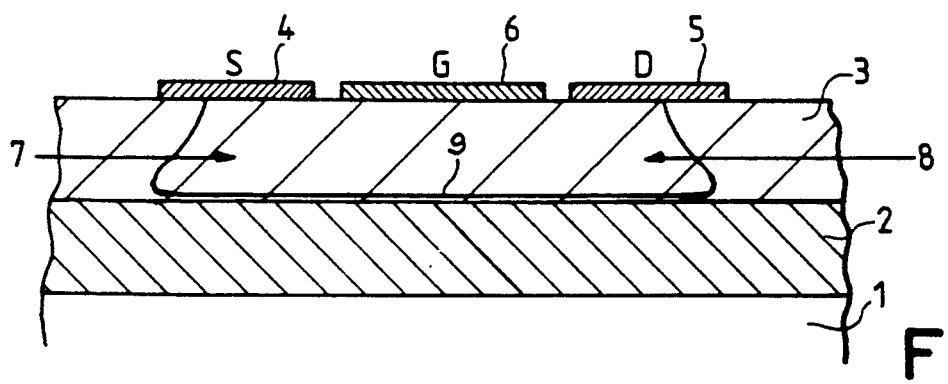

The working of this transistor is explained by means of FIGS. 2 and 3 wherein the substrate 1 has not been shown, for reasons of simplification.

For a Josephson effect to occur between two layers of superconductors, in the regions 7 and 8 which are located respectively between the source 4 and the layer 2, and between the drain 5 and the layer 2, it is necessary not only for the semiconductor layer 3 to have a thickness smaller than the length of coherence, but also for it to have a sufficient number of electrons in Cooper pairs to provide for a vertical supercurrent in the regions 7 and 8, perpendicularly to the layers.

For a first voltage applied to the gate 6, an enhanced or depleted zone 9 is formed in the region of the channel between the source and drain. This zone 9 is totally included in the semiconductor layer 3. The operation is even simpler in enhanced mode. The depleted zone is partly beneath the source and drain metallizations, since it has been specified that the gate is long, namely that the gate-source spaces and gate-drain spaces are small. The lateral component of this field creates electrons sufficient in number for the Josephson effect to occur at 7 and 8. There is therefore a supercurrent that flows through the circuit formed by the source 4+region 7+layer 2+region 8+drain 5.

Since a supercurrent flows in the layer 2, the region 10, included between the layer 2 and the depleted zone beneath the gate 6, is subjected to the proximity effect and a supercurrent flows therein too.

For a second voltage applied to the gate, in FIG. 3, the zone 9 depleted by the gate shifts. The region 10 then disappears.

But, above all, the depleted zone 9 also shifts horizontally, in the plane of the semiconductor layer 3, until the total depletion of the electrons from the regions 7 and 8 between source/drain and superconductive layer 2. Under these conditions, there can no longer be any Josephson effect for, to convey a supercurrent in the regions 7 and 8, there have to be electrons, whereas they are now depleted.

For this second gate voltage, the transistor is off, and no supercurrent flows in the circuit formed by the source 4+region 7+layer 2+region 8+drain 5. It may be considered that the control channel, which according to the prior art connects the source to the drain, in a direction parallel to the plane of the layers, is replaced, in the structure according to the invention, by two channels which shall be called pseudo-channels to differentiate them from the standard control channel. These two pseudo-channels are perpendicular to the layers and one of them is located between the source and the layer 2 while the other is located between the drain and this very same layer 2. In other words, the transistor according to the invention has two Josephson effect control channels in the regions 7 and 8.

Figure 4:
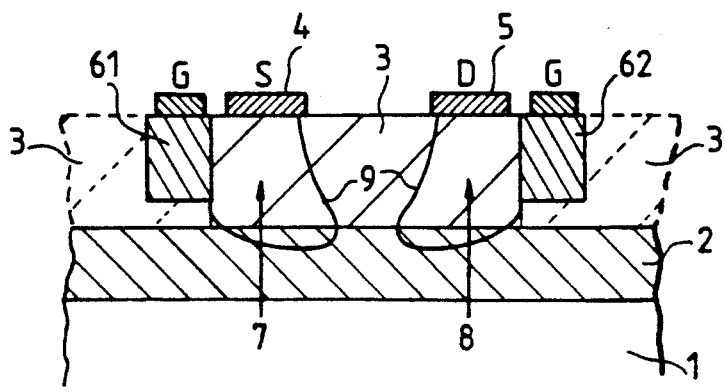
FIG. 4 shows a sectional view of the channel region of a transistor according to the invention, in a structural variant of said channel region.

Since the two control pseudo-channels 7 and 8 are vertical and since, for the second gate voltage, they are horizontally depleted, the transistor structure has a second shape symmetrical with the first one shown in FIG. 4. A double control gate 61 and 62 is deposited outside the volume defined by the pseudo-channels 7 and 8, but in the thickness of the semiconductor layer 3. Under the effect of the two electrical fields exerted by the gate, the electrons in the regions 7 and 8 are depleted from the exterior inwards whereas, in the previous approach of FIG. 3, they were depleted from the interior outwards, by expansion of the depleted zone 9.

The lateral gate, formed by two parts 61 and 62 supplied by one and the same voltage source, may have different embodiments. FIG. 4 shows a mesa structure, limited to the semiconductor layer 3, the flanks of which are metallized at 61 and 62. However, this figure remains valid for a planar structure: in the semiconductor layer 3, reconstituted by means of dashed lines, two grooves are etched and then metallized. What must be done is to limit the depth of the metallizations 61 and 62 so that they do not get short-circuited with the superconductive layer 2 when the pseudo-channels 7 and 8 are conductive.

Figure 5:
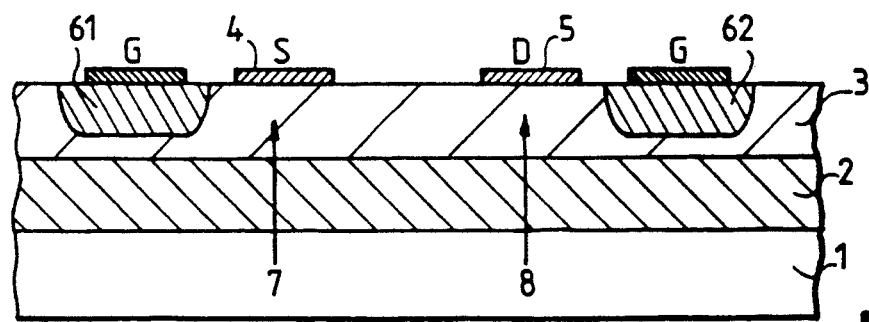
FIG. 5 shows a second example of a structural variant with an implanted gate.

It may be preferable to make two diffusions or two implantations to make the two parts 61 and 62 of the gate, as shown in FIG. 5.

Figure 6:
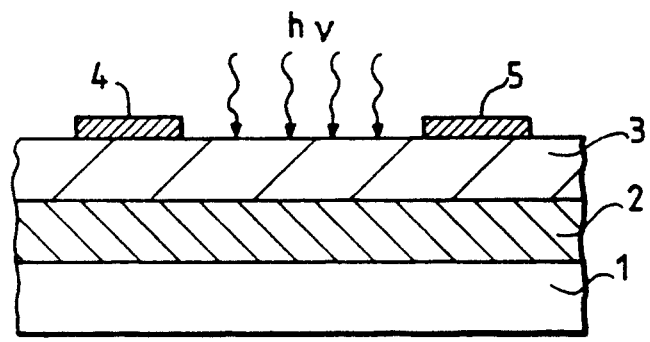
FIG. 6 shows a structure of the device in photodiode form.

Finally, since the length of coherence varies from 10 angstroms to 1000 angstroms, exceptionally up to 1 $\mu$m, depending on the nature of the semiconductive and superconductive materials, the semiconductor layer 3 is transparent, owing to its fineness, to light radiation. Hence, as shown in FIG. 6, the transistor according to the invention may be a phototransistor controlled by an electromagnetic radiation hv. It is necessary, however, to provide for the masking of a part of the surface of the phototransistor so that this phototransistor is depleted, either according to the mechanism of FIG. 3 (central gate) or according to the mechanism of FIG. 4 (external gate).

As compared with standard transistors, the JOFETs have an instrinsic limitation, namely the voltages between source and drain for which the superconductive effects are limited by the condensation energy of the Cooper pairs, i.e. about 1 mV for so-called low temperature superconductors and up to 10 mV for so-called high temperature superconductors. This does not permit the obtaining of high output voltages and hence of high gains.

Figure 7:
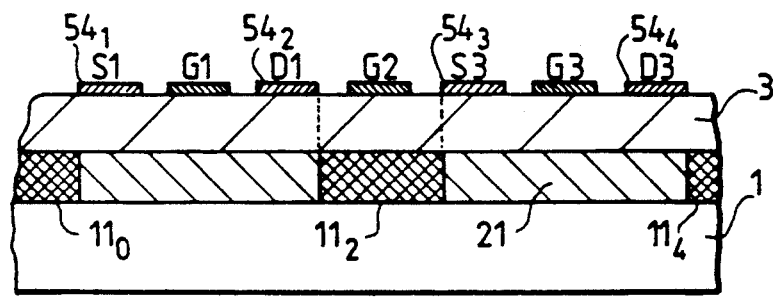
FIG. 7 shows a sectional view and FIG. 8 a plane view of a transistor with high gain, according to the invention.
Figure 8:
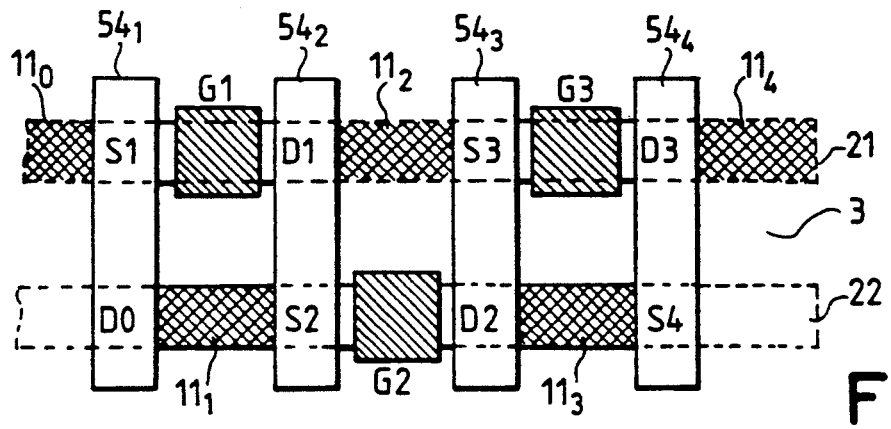

The structure shown in a sectional view in FIG. 7 and in a plane view in FIG. 8 can be used to overcome this drawback. In this structure, a plurality of JOFETs are connected in series. The superconductive layer 2 is no longer a homogeneous layer but has at least two parallel bands 21 and 22 of superconductive material, buried in a matrix of semiconductor material 1 and 3. There may also be a multiple of pairs of parallel bands 21 and 22. Perpendicularly to these bands 21 and 22, parallel bands $54_1$, $54_2$... of superconductive material are deposited on the semiconductor layer 3. The band $54_i$ places the drain 5 of the i-1 order transistor in series with the source 4 of the i order transistor. Thus, as a non-restrictive example, FIG. 8 shows three series-connected transistors (S1, G1, D1) (S2, G2, D2) (S3, G3, D3), the access electrodes of which are D0 and S4. All the gates G1, G2 . . . are parallel-connected, and controlled by one and the same voltage.

This can be achieved only by destroying the superconductivity in certain regions 11 of the bands 21 and 22, to prevent the regions from short-circuiting a transistor. The superconductivity can be cancelled, for example by ion implantation. Thus in FIG. 7, which is a sectional view taken at the band 21, the implanted region $11_2$, placed between the transistors 1 (S1, G1, D1) and 3 (S3, G3, D3) prevents the superconductive band 21 from short-circuiting the transistor 2 (S2, G2, D2) formed on the band 22. The series of transistors forms a crenellated shape which circumvents the non-superconductive islets $11_i$.

Finally, given what has been stated on the role of the semiconductor layer 3, which plays a role only in the regions 7 and 8, it may have inhomogeneous electrical properties and the layer 3 may be made, for example, out of semi-insulating GaAs doped only under the source and drain metallizations, in the regions of the pseudo-channels 7 and 8.

The examples presented have no purpose other than to explain the invention clearly but, naturally, variants evident to those skilled in the art, such as those relating to the nature of the materials and the shape or function of the electrodes, also come within the scope of the invention.

What is claimed is:

1. A Josephson effect semiconductor device comprising:
   a substrate;
   a layer of superconductive material formed on the substrate;
   a layer of semiconductor material formed on an entire area of the layer of superconductive material;
   a source metallization formed on the layer of semiconductor material, wherein the layer of semiconductor material separates the source metallization from the layer of superconductive material; and
   a drain metallization formed on the layer of semiconductor material, wherein the layer of semiconductor material separates the drain metallization from the layer of superconductive material;
   wherein the layer of semiconductor material has a thickness at most equal to the length of coherence of superconductivity in the layer of semiconductor material.

2. The Josephson effect semiconductor device according to claim 1, further comprising a gate metallization formed on the layer of semiconductor material.

3. The Josephson effect semiconductor device according to claim 2, wherein the gate metallization is made of non-superconductive metal and is located between the source and drain metallizations.

4. The Josephson effect semiconductor device according to claim 2, wherein the gate metallization is made of two metallizations of non-superconductive metal, both metallizations being located outside the source and drain metallizations.

5. The Josephson effect semiconductor device according to claim 2, wherein the gate metallization is formed of two regions implanted in the semiconductor layer, both implanted regions being located outside the source and drain metallizations.

6. The Josephson effect semiconductor device according to claim 2, wherein the gate metallization is formed of two regions diffused in the semiconductor layer, both diffused regions being located outside the source and drain metallizations.

7. The Josephson effect semiconductor device according to claim 2, wherein the layer of semiconductor material is doped homogeneously throughout its entire volume.

8. The Josephson effect semiconductor device according to claim 2, wherein the layer of semiconductor material is doped inhomogeneously only in an area between the source metallization and drain metallization.

9. The Josephson effect semiconductor device according to claim 2, wherein at least two Josephson effect devices are series connected and formed on the same substrate, and are separated by at least a region of a non-superconductive material formed in the layer of superconductive material.

10. The Josephson effect semiconductor device according to claim 2, further comprising a control gate metallization which generates an electric field which depletes or enhances the layer of semiconductor material beneath the source and drain metallizations, wherein a control channel is formed by first and second channels, the first channel being located between the source metallization and the layer of superconductive material perpendicular to the layer of semiconductor material, the second channel being located between the drain metallization and the layer of superconductive material perpendicular to the layer of semiconductor material.

11. The Josephson effect semiconductor device according to claim 2, wherein the source and drain metallizations are formed of a superconductive material.

* * * * *